United States Patent
Chen et al.

(10) Patent No.: US 10,564,752 B2
(45) Date of Patent: Feb. 18, 2020

(54) GATE DRIVER AND TOUCH DISPLAY APPARATUS THEREOF

(71) Applicant: Au Optronics Corporation, Hsinchu (TW)

(72) Inventors: Chi-Cheng Chen, Hsinchu (TW); Gui-Wen Liu, Hsinchu (TW)

(73) Assignee: Au Optronics Corporation, Hsinchu (TW)

(*) Notice: Subject to any disclaimer, the term of this patent is extended or adjusted under 35 U.S.C. 154(b) by 0 days.

(21) Appl. No.: 15/942,567

(22) Filed: Apr. 1, 2018

(65) Prior Publication Data
US 2019/0146618 A1 May 16, 2019

(30) Foreign Application Priority Data
Nov. 13, 2017 (TW) ................. 106139222

(51) Int. Cl.
*G09G 3/20* (2006.01)
*G06F 3/041* (2006.01)
*G11C 19/28* (2006.01)

(52) U.S. Cl.
CPC .......... *G06F 3/0412* (2013.01); *G06F 3/0416* (2013.01); *G06F 3/04184* (2019.05); *G09G 3/20* (2013.01); *G11C 19/28* (2013.01); *G11C 19/287* (2013.01); *G09G 2310/0267* (2013.01); *G09G 2310/0286* (2013.01); *G09G 2310/08* (2013.01); *G09G 2354/00* (2013.01)

(58) Field of Classification Search
CPC .................................. G11C 19/28; G09G 3/20
USPC ......................................................... 345/214
See application file for complete search history.

(56) References Cited

U.S. PATENT DOCUMENTS

| | | | |
|---|---|---|---|
| 5,534,892 A | 7/1996 | Tagawa | |
| 2013/0222279 A1 | 8/2013 | Chang et al. | |
| 2015/0302790 A1* | 10/2015 | Dong | G11C 19/28 345/214 |
| 2015/0355762 A1 | 12/2015 | Tripathi et al. | |
| 2016/0299587 A1 | 10/2016 | Huang et al. | |
| 2017/0221411 A1* | 8/2017 | Chang | G09G 3/20 |

FOREIGN PATENT DOCUMENTS

TW M500968 5/2015

\* cited by examiner

*Primary Examiner* — Abdul-Samad A Adediran
(74) *Attorney, Agent, or Firm* — JCIPRNET (57) ABSTRACT

A gate driver and a touch display apparatus thereof are provided. The gate driver includes a plurality of shift registers and at least one loop circuit. The shift registers provide multiple gate signals to a touch display module. The loop circuit is coupled in series with the shift registers and receives at least one touch switching signal to set a loop time of the loop circuit. The touch display module performs at least one touch scan during the loop time.

20 Claims, 7 Drawing Sheets

GATE DRIVER AND TOUCH DISPLAY APPARATUS THEREOF

CROSS-REFERENCE TO RELATED APPLICATION

This application claims the priority benefit of Taiwan application serial no. 106139222, filed on Nov. 13, 2017. The entirety of the above-mentioned patent application is hereby incorporated by reference herein and made a part of this specification.

BACKGROUND OF THE INVENTION

1. Field of the Invention

The invention relates to a driver of a display panel, and particularly relates to a gate driver and a touch display apparatus thereof.

2. Description of Related Art

In recent years, the demands for high resolution (e.g., UHD) in high-end business laptops are increasing, and features such as power-saving, light weight, thinness, and slim bezel are also common in the specification. Besides, through the development of touch technologies, touch pens, which require a low noise application environment, may become a standard component in the future.

In a touch display apparatus, the noise is mainly contributed by voltage changes at end points of transistors (such as TFTs) in the display panel and changes of levels of pixel voltages and gate signals on gate lines and source lines. Thus, in order for touch pens to operate normally, how to avoid or reduce the influences of noise of the display panel on operation of the touch pen becomes an issue when designing a touch display apparatus.

SUMMARY OF THE INVENTION

The invention provides a gate driver and a touch display apparatus capable of preventing noise of a display panel for influencing functioning of a touch pen without affecting functioning of the display panel.

A gate driver according to an embodiment of the invention includes a plurality of shift registers and at least one loop circuit. The shift registers provide multiple gate signals to a touch display module. The loop circuit is coupled in series with the shift registers and receives at least one touch switching signal to set a loop time of the loop circuit. The touch display module performs at least one touch scan during the loop time.

A touch display apparatus according to an embodiment of the invention includes a touch display module, a timing controller, a source driver, a touch driving circuit, and a gate driver. The source driver is coupled to the timing controller and the touch display module and controlled by the timing controller to provide a plurality of pixel voltages to the touch display module. The touch driving circuit is coupled to the timing controller and the touch display module and controlled by the timing controller to scan the touch display module. The gate driver is coupled to the timing controller and the touch display module and controlled by the timing controller to provide a plurality of gate signals to the touch display module. The gate driver includes a plurality of shift registers and at least one loop circuit. The shift registers provide multiple gate signals to a touch display module. The loop circuit is coupled in series with the shift registers and receives at least one touch switching signal to set a loop time of the loop circuit. The touch display module performs at least one touch scan during the loop time.

Based on the above, in the gate driver and the touch display apparatus according to the embodiments of the invention, when the touch module performs scanning, the loop circuit is adapted to suspend outputting of the gate signal. Accordingly, the influence of the noise of the display panel on a touch operation of a touch pen or a finger may be suppressed, and the display panel may operate normally.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
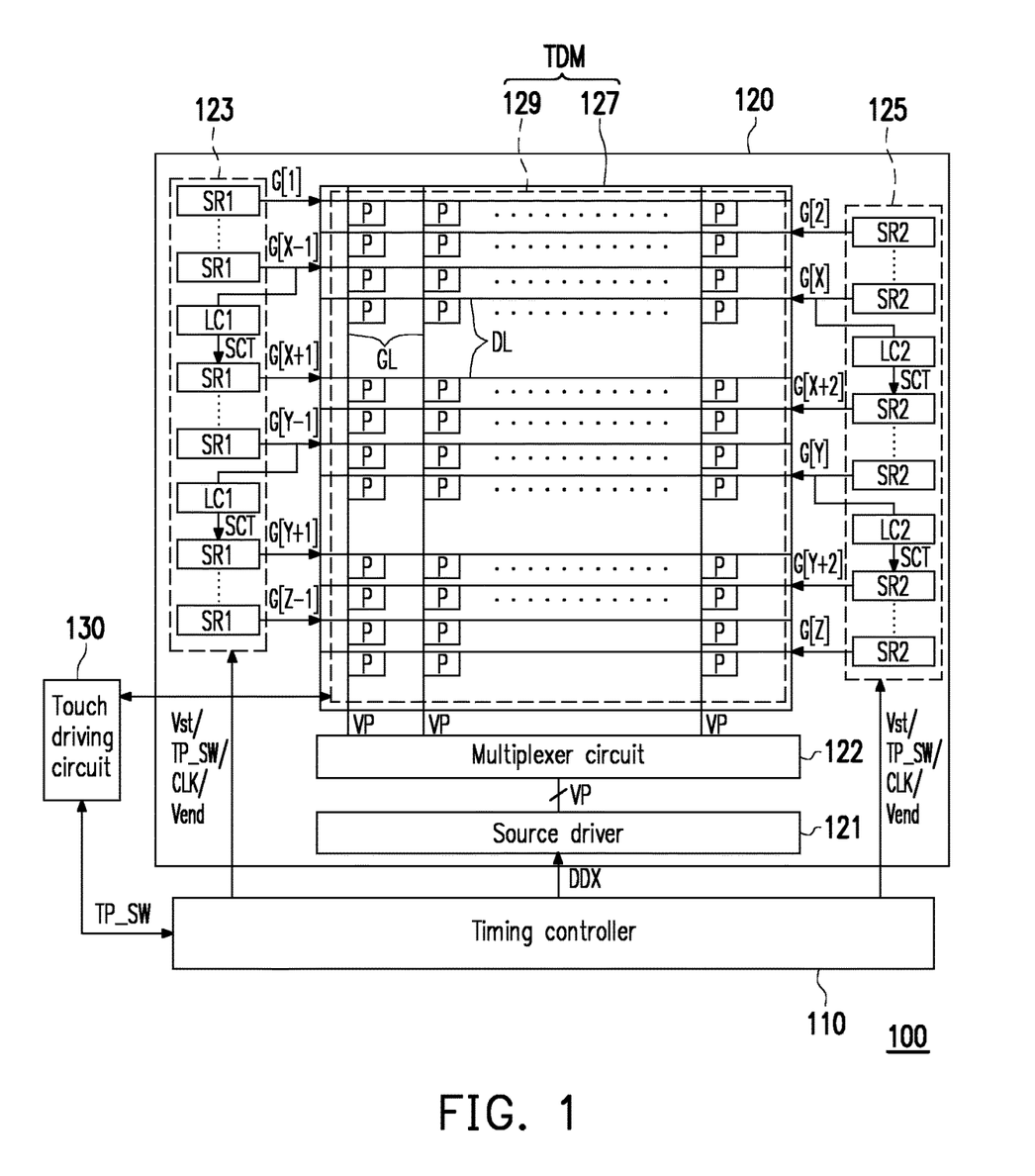
FIG. 1 is a schematic view illustrating a system of a touch display apparatus according to an embodiment of the invention.

FIG. 1 is a schematic view illustrating a system of a touch display apparatus according to an embodiment of the invention. Referring to FIG. 1, in the embodiment, a touch display apparatus 100 includes a timing controller 110, a touch display panel 120, and a touch driving circuit 130. In addition, the touch display panel 120 includes a source driver 121, a multiplexer circuit 122, gate drivers (GOA) 123 and 125, a pixel array 127, and a touch module 129. In the embodiment, the touch display panel 120 may include the multiplexer circuit 122. Nevertheless, the multiplexer circuit 122 may be omitted in other embodiments. The touch module 129 may be configured in an in-cell or on-cell form and integrated with the pixel array 127 to form a touch display module TDM. However, the embodiments of the invention do not exclude integration of the touch module 128 in an out-cell form.

The source driver 121 is coupled to the timing controller 110 and the multiplexer 122 and controlled by the timing controller 110 to provide a plurality of pixel voltages VP to the pixel array 127. In addition, the source driver 121 at least receives display data DDX. The multiplexer circuit 122 is coupled to the pixel array 127 of the touch display module TDM to transmit the received pixel voltages VP to the pixel array 127. The gate drivers 123 and 125 are coupled to the timing controller 110 and the pixel array 127 of the touch display module TDM, and are controlled by the timing controller 110 to provide a plurality of gate signals G[1] to G[Z] to the pixel array 127 of the touch display module TDM, wherein Z is a positive integer. The gate drivers 123 and 125 have the same circuit structure but are disposed on two opposite sides (shown on left and right sides here as an example) of the touch display module 120, so as to alternately provide the gate signals G[1] to G[Z]. In addition, the gate drivers 123 and 125 at least receive a vertical start signal Vst, a touch switching signal TP_SW, a set of clock signals CLK, and an end signal Vend. The gate driver (GOA) may be one or more independent sets of shift registers. The embodiments of the invention do not intend to impose a limitation on this regard.

The pixel array 127 includes pixels P arranged into an array, a plurality of gate lines GL coupled to the gate drivers 123 and 125 to receive the gate signals G[1] to G[Z], and a plurality of source lines DL coupled to the multiplexer circuit 122 to receive the pixel voltages VP. In addition, the respective pixels P are coupled to the corresponding gate lines GL and the corresponding source lines. The touch driving circuit 130 is coupled to the timing controller 110 and the touch module 129 of the touch display module TDM, and is controlled by the timing controller 110 to scan the touch module 129. In addition, the touch driving circuit 130 at least receives a touch switching signal TP_SW.

The gate drivers 123 and 125 respectively include a plurality of shift registers (e.g., SR1 or SR2) and two loop circuits (e.g., LC1 or LC2). The shift registers SR1 and SR2 are coupled to the pixel array 127, and are triggered by the vertical start signal Vst to be sequentially started based on the set of clock signals CLK, so as to provide the gate signals G[1] to G[Z] to the pixel array 127. In addition, the shift registers SR1 and SR2 may be terminated under the control of the end signal Vend. In the respective gate drivers 123 and 125, the loop circuits (e.g., LC1 or LC2) and the shift registers (e.g., SR1 or SR2) are coupled in series and receive the touch switching signal TP_SW to set an operation time (also referred to as a loop time) of the loop circuits (e.g., LC1 or LC2). In addition, the number of the touch switching signals TP_SW may correspond to the number of the loop circuits (e.g., LC1 or LC2).

In the embodiment, in the gate driver 123, the loop circuits LC1 are assumed to be disposed between the shift registers SR1 providing the gate signals G[X−1] and G[X+1] and disposed between the shift registers SR1 providing the gate signals G[Y−1] and G[Y+1], wherein X and Y are respectively positive integers, and X<Y<Z. In addition, the loop circuits LC1 are triggered by the gate signal (e.g., G[X−1] or G[Y−1]) of the shift register SR1 at the previous stage to start the loop time, and output a continued trigger signal SCT to the shift register SR1 at the next stage when the loop time ends.

In the gate driver 125, the loop circuits LC2 are assumed to be disposed between the shift registers SR2 providing the gate signals G[X] and G[X+2] and disposed between the shift registers SR2 providing the gate signals G[Y] and G[Y+2]. In addition, the loop circuits LC2 are triggered by the gate signal (e.g., G[X] or G[Y]) of the shift register SR2 at the previous stage to start the loop time, and output the continued trigger signal SCT to the shift register SR2 at the next stage when the loop time ends.

Besides, during the loop time, the gate drivers 123 and 125 do not provide any gate signal to the pixel array 127, and the multiplexer circuit 122 may cut off a connection (i.e., result in a floating state) between the source driver 121 and the source lines DL, or the source driver 121 may provide the pixel voltages VP corresponding to black (or a low gray-scale value) to the source lines DL. Under the circumstance, the touch driving circuit 130 is controlled by the touch switching signal TP_SW to perform one or more touch scans on the touch module 129.

More specifically, since the display data DDX and the touch switching signal TP_SW are provided by the timing controller 110, the timing controller 110 may transmit the display data DDX of black to the source driver 121 during a touch period when the touch driving circuit 130 performs scanning. A frame period may be defined as Tvb+Z*TH+TLC, wherein Tvb represents a time duration of a vertical blank period, TH represents a time duration of a horizontal scan period, and TLC represents the loop time. Besides, when a delay time of the loop circuits LC1 and LC2 is substantially equal to an integral multiple of the horizontal scan period, the loop time TLC may be expressed as n*TH, wherein n is a positive integer and is proportional to the number of times that the loop circuits LC are executed (i.e., the number of times of delays).

In the embodiment, the source driver 121 and the gate drivers 123 and 125 are disposed on the touch display panel 120. However, in some embodiments, the source driver 121 and the gate drivers 123 and 125 are disposed externally to the touch display panel 120. In other words, only the pixel array 127 is disposed in the touch display panel 120. The different configurations may result from and depend on the types of the touch display panel, and the embodiments of the invention do not intend to impose a specific limitation on this regard.

In the embodiment, the gate drivers 123 and 125 respectively include two loop circuits (e.g., LC1 or LC2). However, in other embodiments, the gate drivers 123 and 125 may respectively include one loop circuit (e.g., LC1 or LC2) or three or more loop circuits (e.g., LC1 or LC2), and the number of the touch switching signals TP_SW may be correspondingly changed into one or three or more, depending on the needs of people having ordinary skill in the art.

Figure 2:
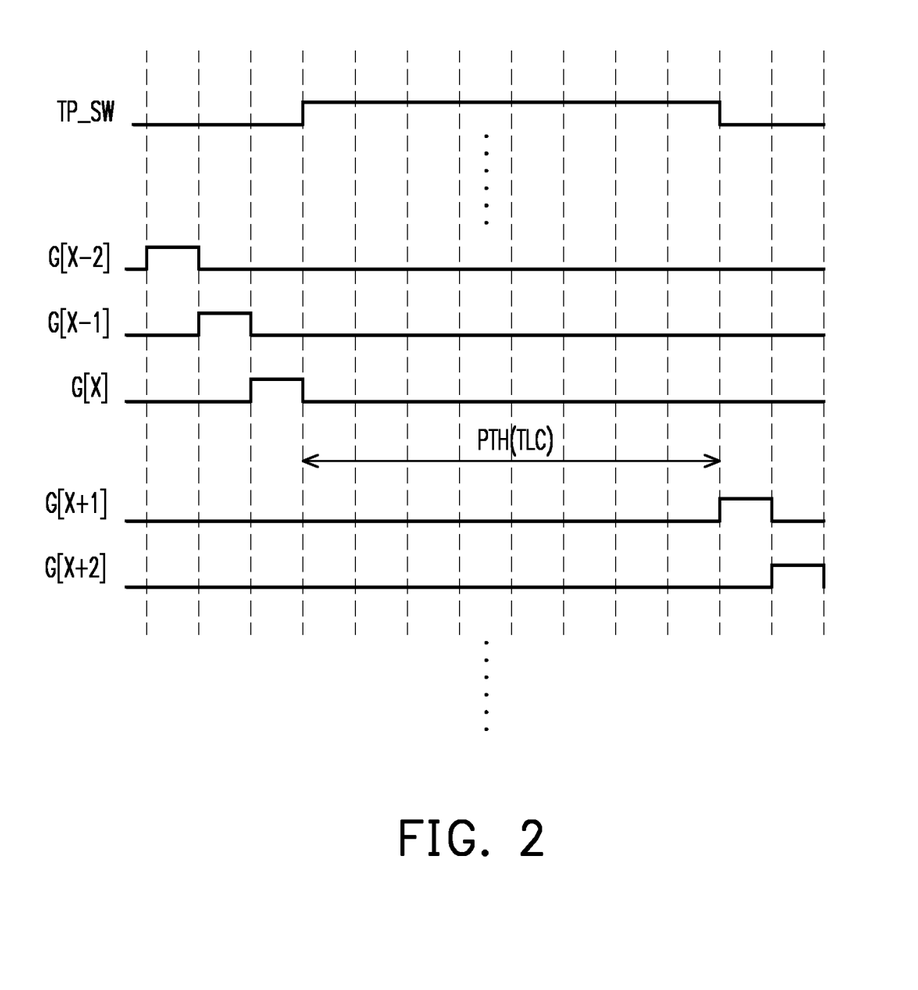
FIG. 2 is a schematic view illustrating a driving waveform of a touch display apparatus according to an embodiment of the invention.

FIG. 2 is a schematic view illustrating a driving waveform of a touch display apparatus according to an embodiment of the invention. Referring to FIGS. 1 and 2, the gate signals G[1] to G[Z] are sequentially enabled (e.g., at a high level). In addition, after the gate signal G[X] is enabled, the touch switching signal TP_SW is subsequently enabled. When the touch switching signal TP_SW is enabled, the loop circuits LC1 and LC2 are controlled by the gate signals G[X−1] and G[X] to start operating. Hence, the gate signals G[1] to G[Z] are kept disabled (e.g., at a low level), and a time period that the gate signals G[1] to G[Z] are kept disabled is a touch period PTH (i.e., the loop time TLC). When the touch switching signal TP_SW is disabled, the loop circuits LC1 and LC2 provide the continued trigger signal SCT to the shift registers SR1 and SR2 at the next stage.

Accordingly, the loop time TLC may correspond to an enabling time of the touch switching signal TP_SW. In addition, during the enabling time of the touch switching signal TP_SW (i.e., the loop time TLC), the source driver 121 may provide the pixel voltage VP corresponding to black, or a plurality of output ends of the source driver is in a floated state, based on the circuit design. The embodiments of the invention do not intend to impose a limitation on this regard.

Figure 3:
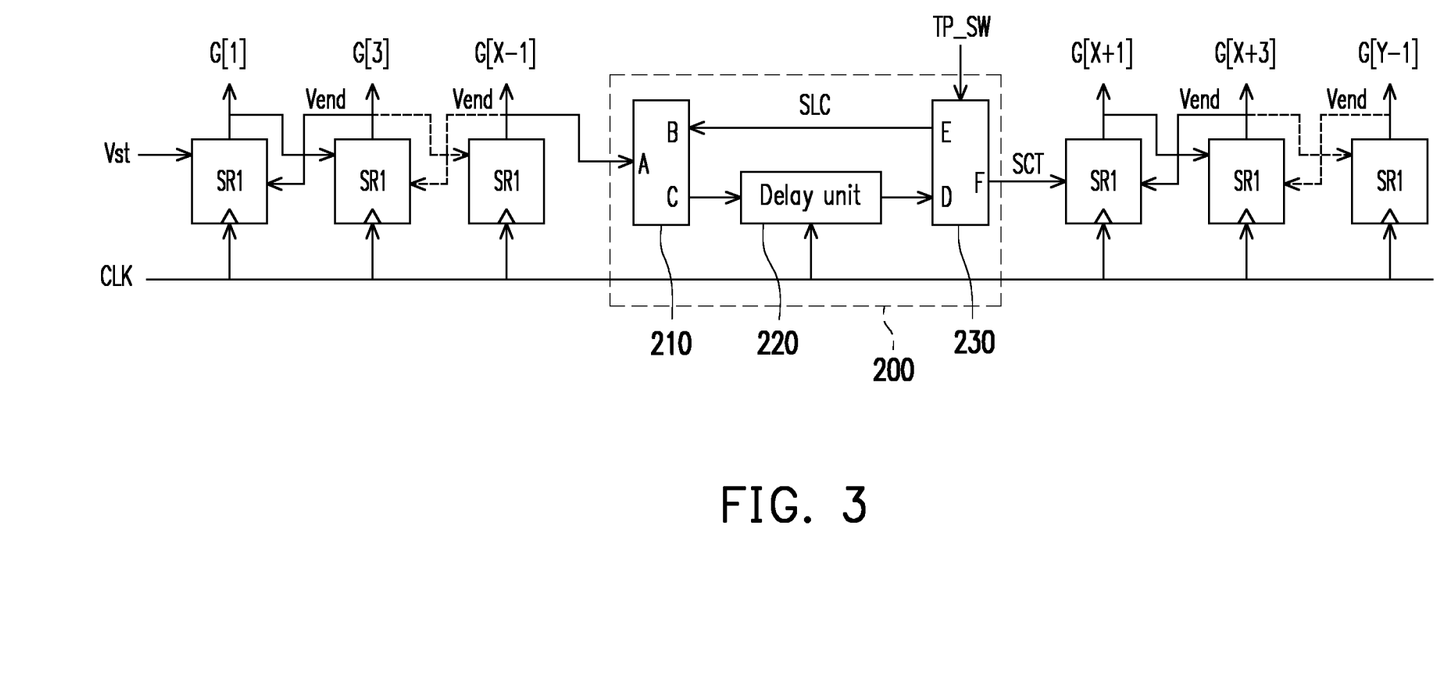
FIG. 3 is a schematic view illustrating a system of a gate driver according to an embodiment of the invention.

FIG. 3 is a schematic view illustrating a system of a gate driver according to an embodiment of the invention. Referring to FIGS. 1 and 3, in the respective gate drivers 123 and 125, the gate signals G[1] to G[Z] output by the respective shift registers SR1 and SR2 may be adopted at the output ends of the shift registers SR1 and SR2 at the previous stage as the end signal Vend. Here, only the gate driver 123 is shown for an illustrative purpose. In addition, a loop circuit 200 is used to describe the loop circuit LC1, and the circuit structure of the loop circuit LC2 may be referred to the structure of the loop circuit LC1. The loop circuit 200 includes a first switching circuit 210, a delay unit 220, and a second switching circuit 230. In addition, the delay unit 220 and the shift register SR1 share one set of clock signals CLK (i.e., the shift register SR1 and the loop circuit 200 share the same set of clock signals).

The first switching circuit 210 has a first input end A coupled to the gate signal G[X−1] of the shift register SR1 at the previous stage, a second input end B receiving the loop signal SLC, and an output end C. The delay unit 220 has an input end coupled to the output end C of the first switching circuit 210 and an output end. The second switching circuit 230 receives the touch switching signal TP_SW, and has an input end D coupled to the output end of the delay unit 220, a first output end E providing the loop signal SLC, and a second output end F coupled to the shift register SR1 at the next stage. In addition, the second output end F provides the continued trigger signal SCT.

Figure 4:
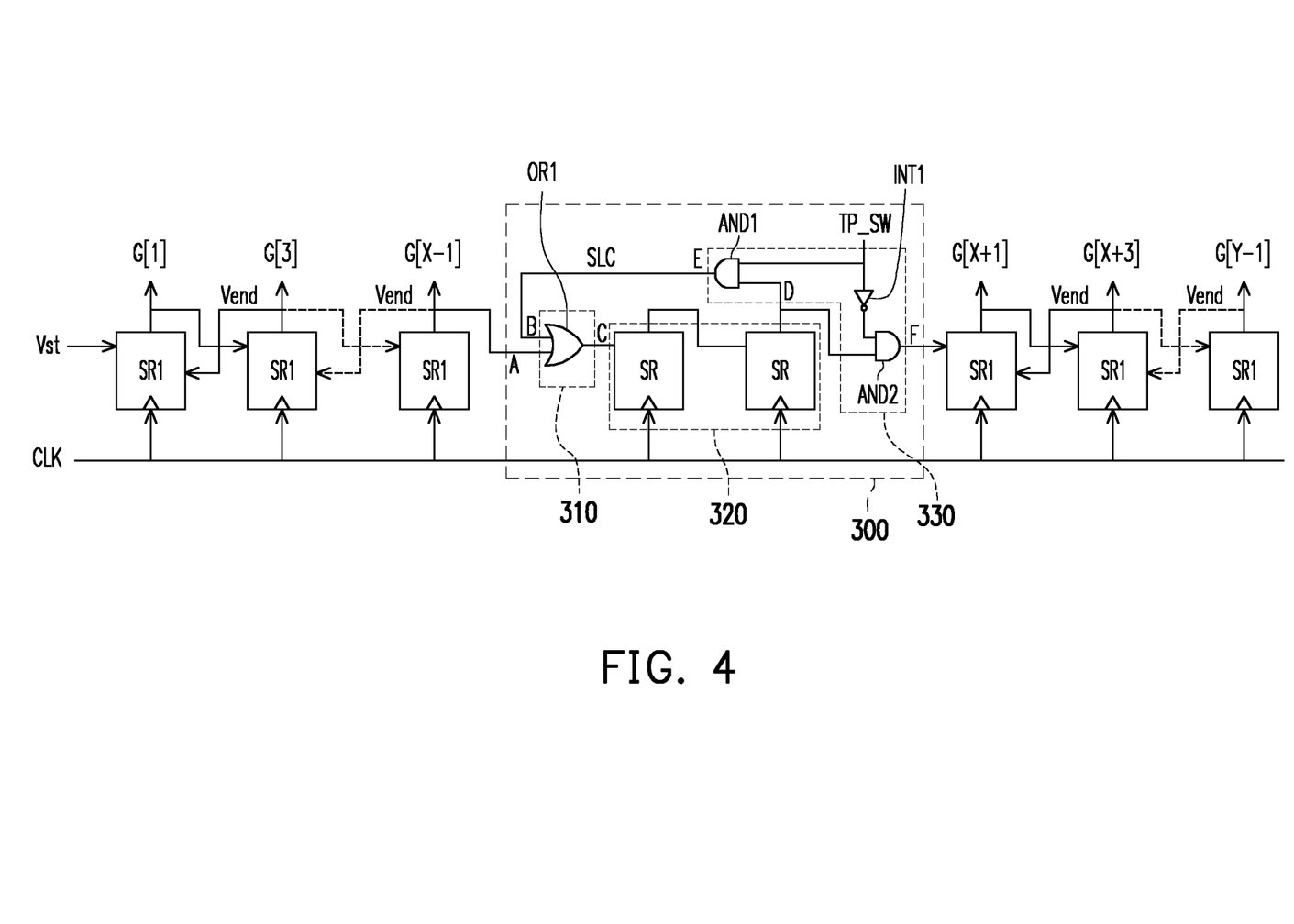
FIG. 4 is a schematic view illustrating a circuit of a gate driver according to an embodiment of the invention.

FIG. 4 is a schematic view illustrating a circuit of a gate driver according to an embodiment of the invention. Referring to FIGS. 3 and 4, in the embodiment, a loop circuit 300 is used to describe the loop circuit LC1. In addition, similar to the loop circuit 200, the loop circuit 300 includes a first switching circuit 310, a delay unit 320, and a second switching circuit 330. The first switching circuit 310 includes an OR gate OR1. The OR gate includes a plurality of input ends coupled to the first input end A and the second input end B of the first switching circuit 310 and an output end coupled to the output end C of the first switching circuit 310.

The delay unit 320 has two shift registers SR receiving the set of clock signals CLK and serially connected between the input end and the output end of the delay unit 320. The second switching circuit 330 includes a first AND gate AND1, an inverter INT1, and a second AND gate AND2. The first AND gate AND1 has a plurality of input ends coupled to the output end of the delay unit 320 and the touch switching signal TP_SW and an output end coupled to the first output end E of the second switching circuit 330. In addition, the output end of the first AND gate AND1 provides the loop signal SLC. The inverter INT1 has an input end receiving the touch switching signal TP_SW and an output end. The second AND gate AND2 has a plurality of input ends coupled to the output end of the delay unit 320 and the output end of the inverter INT1 and an output end coupled to the second output end F of the second switching circuit 330. In addition, the output end of the second AND gate AND2 provides the continued trigger signal SCT.

In the embodiment, the delay unit 320 has two shift registers SR, for example. However, in other embodiments, the delay unit 320 may have at least one shift register SR or at least one flip-flop of an arbitrary type (e.g., a D flip-flop, a T flip-flop, an RS flip-flop, or a JK flip-flop, etc.), depending on the circuit design. The embodiment of the invention does not intend to impose a limitation on this regard.

Figure 5:
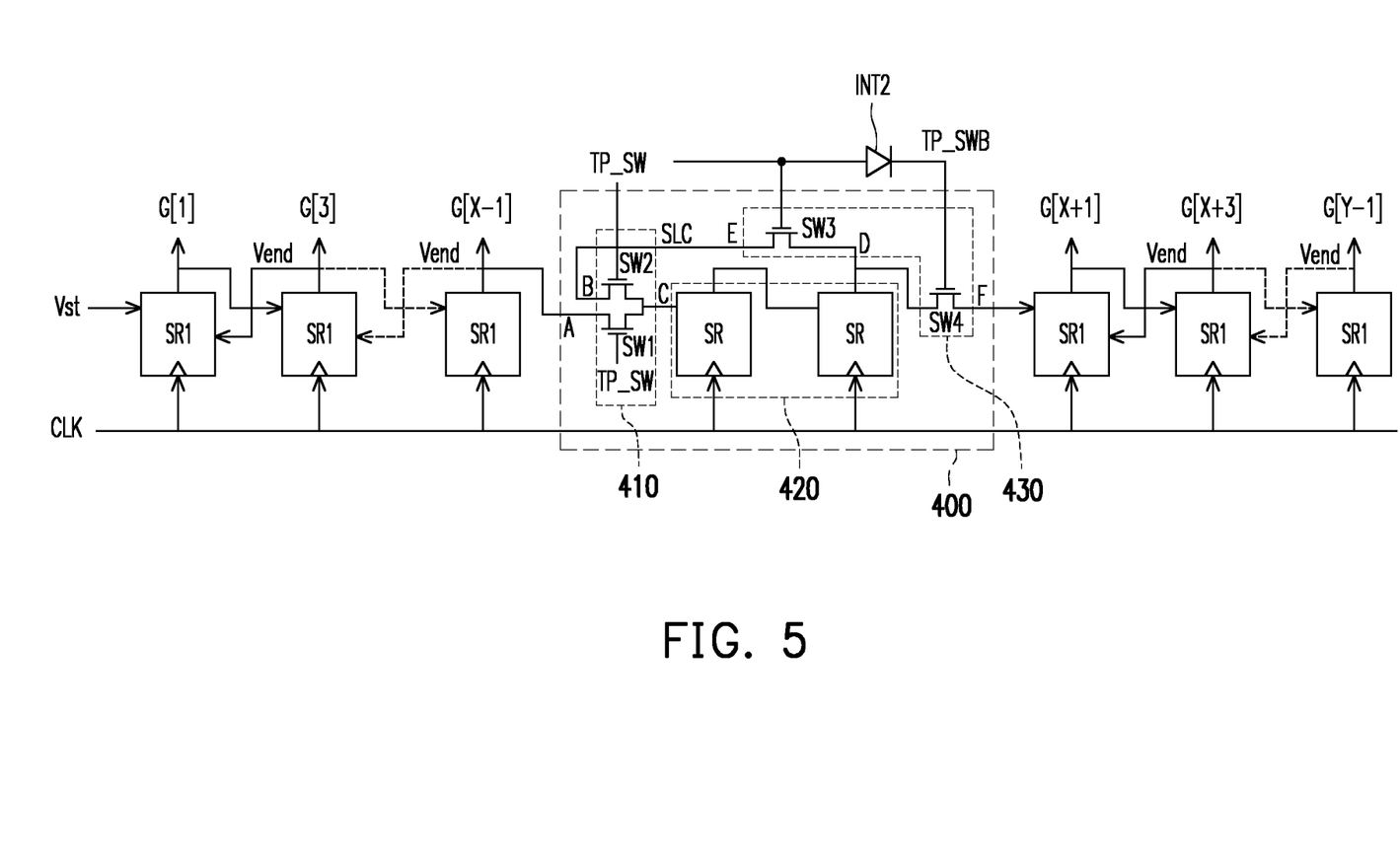
FIG. 5 is a schematic view illustrating a circuit of a gate driver according to another embodiment of the invention.

FIG. 5 is a schematic view illustrating a circuit of a gate driver according to another embodiment of the invention. Referring to FIGS. 3 and 5, in the embodiment, a loop circuit 400 is used to describe the loop circuit LC1. In addition, similar to the loop circuit 200, the loop circuit 400 includes a first switching circuit 410, a delay unit 420, and a second switching circuit 430. The first switching circuit 410 includes a first switch SW1 and a second switch SW2. The first switch SW1 has a first end coupled to the first input end A of the first switching circuit 410, a second end coupled to the output end C of the first switching circuit 410, and a control end receiving the touch switching signal TP_SW. The second switch SW2 has a first end coupled to the second input end B of the first switching circuit 410, a second end coupled to the output end C of the first switching circuit 410, and a control end receiving the touch switching signal TP_SW.

The delay unit 420 has two shift registers SR receiving the set of clock signals CLK and serially connected between the input end and the output end of the delay unit 420. The second switching circuit 430 includes a third switch SW3 and a fourth switch SW4. The third switch SW3 has a first end coupled to the input end D of the second switching circuit 430, a second end coupled to the first output end E of the first switching circuit 430, and a control end receiving the touch switching signal TP_SW. In addition, the second end of the third switch SW3 provides the loop signal SLC. The fourth switch SW4 has a first end coupled to the input end D of the second switching circuit 430, a second end coupled to the second output end F of the second switching circuit 430, and a control end receiving an inverted signal TP_SWB of the touch switching signal TP_SW. In addition, the second end of the fourth switch SW4 provides the continued trigger signal SCT.

In the embodiment, the delay unit 420 has two shift registers SR, for example. However, in other embodiments, the delay unit 420 may have at least one shift register SR or at least one flip-flop of an arbitrary type (e.g., a D flip-flop, a T flip-flop, an RS flip-flop, or a JK flip-flop, etc.), depending on the circuit design. The embodiment of the invention does not intend to impose a limitation on this regard. In addition, the inverted signal TP_SWB may be generated by an inverter INT2. However, the embodiments of the invention do not intend to impose a limitation on this regard.

Figure 6:
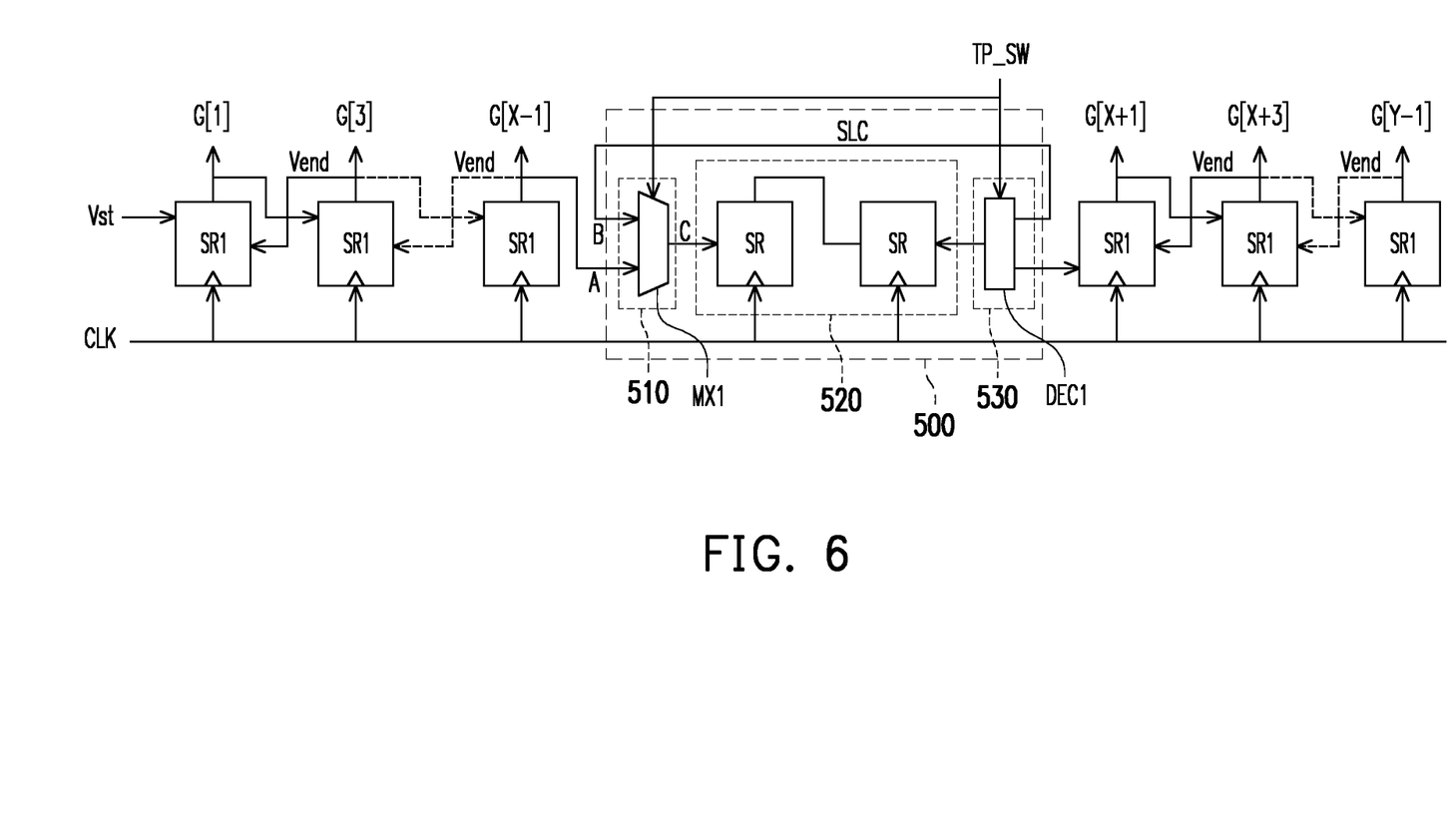
FIG. 6 is a schematic view illustrating a circuit of a gate driver according to yet another embodiment of the invention.

FIG. 6 is a schematic view illustrating a circuit of a gate driver according to yet another embodiment of the invention. Referring to FIGS. 3 and 6, in the embodiment, a loop circuit 500 is used to describe the loop circuit LC. In addition, similar to the loop circuit 200, the loop circuit 500 includes a first switching circuit 510, a delay unit 520, and a second switching circuit 530. The first switching circuit 510 includes a first multiplexer MX1. The first multiplexer MX1 has a control end receiving the touch switching signal TP_SW, a plurality of input ends coupled to the first input end A and the second input end B of the first switching circuit 410, and an output end coupled to the output end C of the first switching circuit 410.

The delay unit 520 has two shift registers SR receiving the set of clock signals CLK and serially connected between the input end and the output end of the delay unit 520. The second switching circuit 530 includes a first decoder DEC1. The first decoder DEC1 has a control end receiving the touch switching signal TP_SW, an input end coupled to the input end D of the second switching circuit 530, and a plurality of output ends coupled to the first output end E and the second output end F of the second switching circuit 530. In addition, the output ends of the first decoder DEC1 respectively provide the loop signal SLC and the continued trigger signal SCT.

In the embodiment, the delay unit 520 has two shift registers SR, for example. However, in other embodiments, the delay unit 520 may have at least one shift register SR or at least one flip-flop of an arbitrary type (e.g., a D flip-flop, a T flip-flop, an RS flip-flop, or a JK flip-flop, etc.), depending on the circuit design. The embodiment of the invention does not intend to impose a limitation on this regard.

Figure 7:
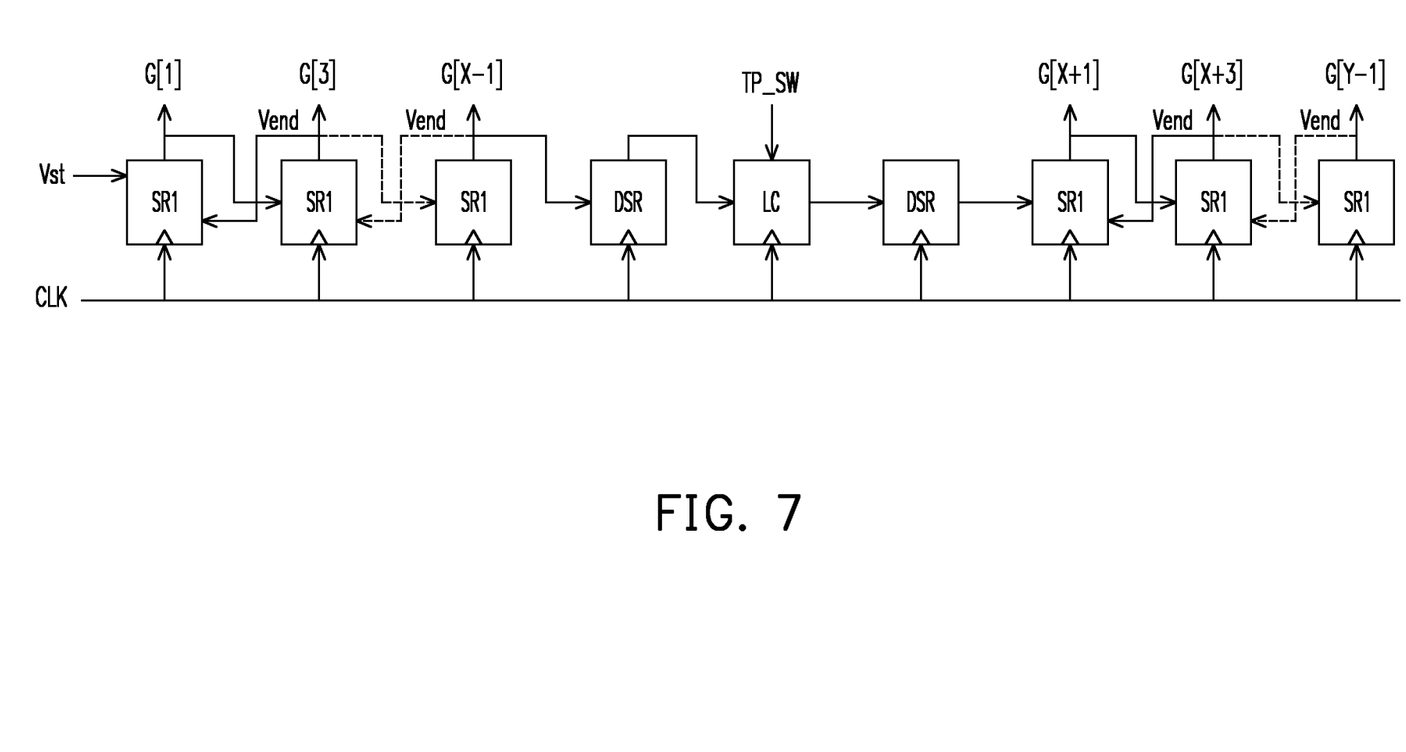
FIG. 7 is a schematic view illustrating a system of a gate driver according to another embodiment of the invention.

FIG. 7 is a schematic view illustrating a system of a gate driver according to another embodiment of the invention. Referring to FIGS. 1 and 7, in the embodiment, the gate driver (e.g., the gate driver 123 or 125) may further provide a plurality of dummy shift registers DSR. The dummy shift registers DSR are coupled to the loop circuit (e.g., the loop circuit LC1 or LC2) and the shift registers (e.g., the shift registers SR1 or SR2) in sense, and the dummy shift registers DSR are disposed between the loop circuit (e.g., the loop circuit LC1 or LC2) and the shift registers (e.g., the shift registers SR1 or SR2) to separate the loop circuit (e.g., the loop circuit LC1 or LC2) and the shift registers (e.g., the shift registers SR1 or SR2).

In view of the foregoing, in the gate driver and the touch display apparatus according to the embodiments of the invention, when the touch module performs scanning, the loop circuit is adapted to suspend outputting of the gate signal. Accordingly, the influence of the noise of the display panel on a touch operation of a touch pen or a finger may be suppressed, and the display panel may operate normally. In addition, when the touch module performs scanning, the output end of the source driver may be in a floating state or provide the pixel voltages displaying black (or a low grayscale value) to further suppress the noise of the display panel.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A gate driver, comprising:
a plurality of shift registers, configured to receive a set of clock signals and provide a plurality of gate signals to a touch display module; and
at least one loop circuit, coupled in series with the plurality of shift registers receiving at least one touch switching signal different from the set of clock signals to set a loop time of the at least one loop circuit and receiving the set of clock signals, wherein during the loop time, the touch display module performs at least one touch scan.

2. The gate driver as claimed in claim 1, wherein the plurality of shift registers and the at least one loop circuit share a set of clock signals.

3. The gate driver as claimed in claim 1, wherein the loop time corresponds to an enabling time of the at least one touch switching signal.

4. The gate driver as claimed in claim 1, wherein the at least one loop circuit is triggered by the gate signal of the shift register at a previous stage to start the loop time, and outputs a continued trigger signal to the shift register at a next stage when the loop time ends.

5. The gate driver as claimed in claim 4, wherein the at least one loop circuit comprises:
a first switching circuit, having a first input end coupled to the gate signal of the shift register at the previous stage, a second input end receiving a loop signal, and an output end;
a delay unit, having an input end coupled to the output end of the first switching circuit and an output end; and
a second switching circuit, receiving the at least one touch switching signal, and having an input end coupled to the output end of the delay unit, a first output end providing the loop signal, and a second output end coupled to the shift register at the next stage.

6. The gate driver as claimed in claim 5, wherein the delay unit comprises at least one shift register or at least one flip-flop.

7. The gate driver as claimed in claim 5, wherein the first switching circuit comprises:
an OR gate, having a plurality of input ends and an output end, wherein the plurality of input ends of the OR gate are coupled to the first input end and the second output end of the first switching circuit, and the output end of the OR gate is coupled to the output end of the first switching circuit,
wherein the second switching circuit comprises:
a first AND gate, having a plurality of input ends and an output end, wherein the plurality of input ends of the first AND gate are coupled to the output end of the delay unit and the at least one touch switching signal, and the output end of the first AND gate is coupled to the first output end of the second switching circuit;
an inverter, having an input end receiving the at least one touch switching signal and an output end; and
a second AND gate, having a plurality of input ends and an output end, wherein the plurality of input ends of the second AND gate are coupled to the output end of the delay unit and the output end of the inverter, and the output end of the second AND gate is coupled to the second output end of the second switching circuit.

8. The gate driver as claimed in claim 5, wherein the first switching circuit comprises:
a first multiplexer, having a control end receiving the at least one touch switching signal, a plurality of input ends coupled to the first input end and the second input end of the first switching circuit, and an output end coupled to the output end of the first switching circuit,
wherein the second switching circuit comprises:
a first decoder, having a control end receiving the at least one touch switching signal, an input end coupled to the input end of the second switching circuit, and a plurality of output ends coupled to the first output end and the second output end of the second switching circuit.

9. The gate driver as claimed in claim 5, wherein the first switching circuit comprises:
a first switch, having a first end coupled to the first input end of the first switching circuit, a second end coupled to the output end of the first switching circuit, and a control end receiving the at least one touch switching signal; and
a second switch, having a first end coupled to the second input end of the first switching circuit, a second end coupled to the output end of the first switching circuit, and a control end receiving the at least one touch switching signal,
wherein the second switching circuit comprises:
a third switch, having a first end coupled to the input end of the second switching circuit, a second end coupled to the first output end of the first switching circuit, and a control end receiving the at least one touch switching signal; and a fourth switch, having a first end coupled to the input end of the second switching circuit, a second end coupled to the second output end of the second switching circuit, and a control end receiving an inverted signal of the at least one touch switching signal.

10. The gate driver as claimed in claim 5, further comprising a plurality of dummy shift registers coupled in series with the at least one loop circuit and the plurality of shift registers and configured to separate the at least one loop circuit and the plurality of shift registers.

11. A touch display apparatus, comprising:
a touch display module;
a timing controller;
a source driver, coupled to the timing controller and the touch display module and controlled by the timing controller to provide a plurality of pixel voltages to the touch display module;
a touch driving circuit, coupled to the timing controller and the touch display module and controlled by the timing controller to scan the touch display module;
a gate driver, coupled to the timing controller and the touch display module and controlled by the timing controller to provide a plurality of gate signals to the touch display module, wherein the gate driver comprises:
a plurality of shift registers, configured to receive a set of clock signals and provide the gate signals; and
at least one loop circuit, coupled in series with the plurality of shift registers, receiving a touch switching signal from the timing controller different from the set of clock signals to set a loop time of the at least one loop circuit and receiving the set of clock signals, wherein during the loop time, the touch driving circuit performs a touch scan on the touch display module.

12. The touch display apparatus as claimed in claim 11, wherein the plurality of shift registers and the at least one loop circuit share a set of clock signals.

13. The touch display apparatus as claimed in claim 11, wherein the loop time corresponds to an enabling time of the touch switching signal, and during the enabling time, the source driver provides the pixel voltages displaying black or a low gray-scale value, or a plurality of output ends of the source driver is in a floating state.

14. The touch display apparatus as claimed in claim 11, wherein the at least one loop circuit is triggered by the gate signal of the shift register at a previous stage to start the loop time, and provides a continued trigger signal to the shift register at a next stage when the loop time ends.

15. The touch display apparatus as claimed in claim 14, wherein the at least one loop circuit comprises:
a first switching circuit, having a first input end coupled to the gate signal of the shift register at the previous stage, a second input end receiving a loop signal, and an output end;
a delay unit; having an input end coupled to the output end of the first switching circuit and an output end; and
a second switching circuit, receiving the touch switching signal, and having an input end coupled to the output end of the delay unit, a first output end providing the loop signal, and a second output end coupled to the shift register at the next stage.

16. The touch display apparatus as claimed in claim 15, wherein the delay unit has at least one shift register or at least one flip-flop.

17. The touch display apparatus as claimed in claim 15, wherein the first switching circuit comprises:
an OR gate, having a plurality of input ends and an output end, wherein the plurality of input ends of the OR gate are coupled to the first input end and the second output end of the first switching circuit, and the output end of the OR gate is coupled to the output end of the first switching circuit,
wherein the second switching circuit comprises:
a first AND gate, having a plurality of input ends and an output end, wherein the plurality of input ends of the first AND gate are coupled to the output end of the delay unit and the touch switching signal, and the output end of the first AND gate is coupled to the first output end of the second switching circuit;
an inverter, having an input end receiving the touch switching signal and an output end; and
a second AND gate, having a plurality of input ends and an output end, wherein the plurality of input ends of the second AND gate are coupled to the output end of the delay unit and the output end of the inverter, and the output end of the second AND gate is coupled to the second output end of the second switching circuit.

18. The touch display apparatus as claimed in claim 15, wherein the first switching circuit comprises:
a first multiplexer, having a control end receiving the touch switching signal, a plurality of input ends coupled to the first input end and the second input end of the first switching circuit, and an output end coupled to the output end of the first switching circuit,
wherein the second switching circuit comprises:
a first decoder, having a control end receiving the touch switching signal, an input end coupled to the input end of the second switching circuit, and a plurality of output ends coupled to the first output end and the second output end of the second switching circuit.

19. The touch display apparatus as claimed in claim 15, wherein the first switching circuit comprises:
a first switch, having a first end coupled to the first input end of the first switching circuit, a second end coupled to the output end of the first switching circuit, and a control end receiving the touch switching signal; and
a second switch, having a first end coupled to the second input end of the first switching circuit, a second end coupled to the output end of the first switching circuit, and a control end receiving the touch switching signal,
wherein the second switching circuit comprises:
a third switch, having a first end coupled to the input end of the second switching circuit, a second end coupled to the first output end of the first switching circuit, and a control end receiving the touch switching signal; and
a fourth switch, having a first end coupled to the input end of the second switching circuit, a second end coupled to the second output end of the second switching circuit, and a control end receiving an inverted signal of the touch switching signal.

20. The touch display apparatus as claimed in claim 15, further comprising a plurality of dummy shift registers coupled in series with the at least one loop circuit and the plurality of shift registers and configured to separate the at least one loop circuit and the plurality of shift registers.

* * * * *